(12) United States Patent
Brox

(10) Patent No.: US 7,206,248 B2
(45) Date of Patent: Apr. 17, 2007

(54) VOLTAGE BOOSTER DEVICE FOR SEMI-CONDUCTOR COMPONENTS

(75) Inventor: Martin Brox, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/043,949

(22) Filed: Jan. 28, 2005

(65) Prior Publication Data

US 2005/0169088 A1 Aug. 4, 2005

(30) Foreign Application Priority Data

Jan. 30, 2004 (DE) .................. 10 2004 004 785

(51) Int. Cl.
*G11C 5/14* (2006.01)

(52) U.S. Cl. ............ 365/226; 365/189.09; 365/189.11

(58) Field of Classification Search ................ 365/226, 365/189.09, 189.11, 230.01, 230.03
See application file for complete search history.

(56) References Cited

U.S. PATENT DOCUMENTS

| | | | | |
|---|---|---|---|---|
| 5,641,986 A * | 6/1997 | Uchida | ...................... | 257/532 |
| 5,867,442 A * | 2/1999 | Kim et al. | ................... | 365/226 |
| 6,195,306 B1 * | 2/2001 | Horiguchi et al. | .......... | 365/226 |
| 6,519,191 B1 | 2/2003 | Morishita | | |
| 6,654,300 B2 * | 11/2003 | Ikeda | ......................... | 365/201 |
| 6,819,619 B2 * | 11/2004 | Morishita et al. | .......... | 365/226 |
| 6,898,099 B1 * | 5/2005 | Srinivasan et al. | .......... | 365/49 |
| 2004/0109383 A1 * | 6/2004 | Horiguchi et al. | .......... | 365/233 |

* cited by examiner

*Primary Examiner*—Tuan T. Nguyen
*Assistant Examiner*—Dang Nguyen
(74) *Attorney, Agent, or Firm*—Morrison & Foerster LLP

(57) ABSTRACT

A semi-conductor component (1), in particular a memory component, with at least one voltage booster, which makes available an appropriate boosted voltage (VPP, VLL), and which is installed in a corresponding voltage booster area (101*a*) of the semi-conductor component (1), whereby the voltage booster area (101*a*) essentially extends parallel to several devices (9*a*, 8*a*, 8*c*), which are to be provided with the boosted voltage (VPP, VLL), in particular essentially parallel to the lines, for instance word lines (12*a*, 13*a*, 13*b*, 13*c*) controlled by the devices (9*a*, 8*a*, 8*c*).

5 Claims, 2 Drawing Sheets

VOLTAGE BOOSTER DEVICE FOR SEMI-CONDUCTOR COMPONENTS

CLAIM FOR PRIORITY

This application claims priority to Application No. 102004004785.5, which was filed in the German language on Jan. 30, 2004.

TECHNICAL FIELD OF THE INVENTION

The invention relates to a semi-conductor component with at least one voltage booster.

BACKGROUND OF THE INVENTION

In semi-conductor memory components a distinction is made between so-called function memory components (i.e. PLAs, PALs, etc.), and so-called table memory components, i.e. ROM components (ROM=Read Only Memory), and RAM components (RAM=Random Access Memory and/or read-write memory).

A RAM component is a memory device in which data is stored under a specified address, from which the data can later be read out again.

The corresponding address can be input into the RAM component by means of so-called address connections and/or address input pins; several, for instance 16, so-called data connections and/or data input/output pins (I/Os and/or Input/Outputs) are provided for storing and reading out data. By applying an appropriate signal (for instance a read/write signal) to a read/write selector connection and/or pin, a decision can (instantly) be made whether data is to be stored or read out.

Because a RAM component needs to be provided with as many storage cells as possible, it becomes important for the creation of these cells to be kept as simple as possible. With so-called SRAMs (SRAM=Static Random Access Memory) the individual memory cells for instance consist of a few, e.g. six, transistors and so-called DRAMs (DRAM=Dynamic Random Access Memory) usually of only a single suitably controlled capacitor, with the capacitance of which one bit at a time can be stored in the form of charge. This charge only persists for a short period, which means that a so-called "refresh" must be performed regularly, e.g. ca. every 64 ms.

In memory components, especially DRAM components, the individual memory cells—lying next to each other in a multitude of adjacent rows and columns—are arranged in a rectangular matrix (equally divided into several cell fields) and/or a rectangular array (equally divided into several cell fields).

In order to achieve a correspondingly high total storage capacity and/or to achieve the highest data read and/or write speed—instead of one single array—several, for instance four—essentially rectangular—individual arrays (so-called "memory banks") can be arranged in a single RAM component and/or chip ("multi-bank chip").

In order to perform a writing or reading operation, a specific, predetermined sequence of commands must be issued:

First for instance a corresponding word line—specifically allocated to a particular array—(and defined by the "row address") is activated with the help of a word line activation command (activate command (ACT)) (for instance thereby that a corresponding master word line (MWL)—allocated to several superimposed cell fields and running through them is activated first, for instance by means of a master word line driver, for instance installed in a corresponding segment control area, and in reaction hereto the corresponding local word line (LWL), running through a corresponding singular cell filed is activated—for instance by a corresponding, local word line driver lying between the corresponding cell fields in a corresponding segment driver and/or sub-decoder area).

This causes the data values stored in the memory cells allocated to the corresponding word line to be read out by the sense amplifier allocated to that word line ("activated state" of the word line).

Then—with the help of a corresponding read or write (RD and/or WT) command—the appropriate data, accurately specified by the corresponding column address, is output by the sense amplifier(s) allocated to the bit line specified by the corresponding column address (or—conversely—data is then read into the corresponding memory cells).

Next the corresponding word line is deactivated again—with the help of a word line deactivation command (for instance a precharge (PRE) command)—and the corresponding array is prepared for the next word line activation command (activate command (ACT)).

The above sense amplifier(s) is/are in each case allocated to a sense amplifier area—lying between two cell fields—whereby—for reasons of space—one and the same sense amplifier can be allocated to two different cell fields (namely to the two cell fields directly adjacent to the corresponding sense amplifier area)—so-called "shared sense amplifier".

Depending on whether data is to be read from the cell field to the left or to the right of the sense amplifier in question (or from the cell field lying above or below the sense amplifier in question), the corresponding sense amplifier is switched by means of appropriate switches to the corresponding cell field (in particular to the corresponding bit line allocated to the cell field in question) and/or electrically connected to the corresponding cell field, in particular to the corresponding bit line allocated to the cell field in question, or disconnected from the corresponding cell field (and/or the bit line allocated to the cell field in question) and/or electrically separated from the corresponding cell field (and/or from the bit line allocated to that corresponding cell field).

In semi-conductor components, more particularly memory components such as the above RAM, in particular DRAMs, an internal voltage level VINT used inside the component can differ from an externally used voltage level (supply voltage level) VDD used outside the component, for instance an external voltage supply made available to the semi-conductor component.

In particular, the internally used voltage level VINT can for instance be smaller than the externally used voltage level VDD—for instance the internally used voltage level VINT can amount to 1,5 V and the supply voltage level VDD for instance to between 1,5 V and 2,5 V.

In contrast to this, the above sub-decoder, in particular the above local word line driver devices, can be operated by means of "boosted" voltage levels, provided by one or several corresponding voltage booster devices (for instance by a voltage level VPP—for instance signifying a "high logic" word line signal—which is higher than the level VDD of the above external voltage, and by a voltage level VLL—representing a "low logic" word line signal for instance—which may for instance be smaller than 0 V).

The voltage booster device in question may for instance be installed in a central outside area (for instance in a boundary area of the semi-conductor component between two corresponding arrays) of the semi-conductor component, from where—by means of appropriate lines—the voltage levels VPP, VLL made available by the voltage booster devices can then be relayed to the corresponding sub-decoder and/or local word line driver.

This arrangement for instance has the disadvantage, that in particular when the sub-decoder and/or local word line drivers are placed relatively far away from the voltage booster devices—a relatively high voltage drop takes place.

SUMMARY OF THE INVENTION

This invention discloses a novel voltage booster device for semi-conductor components.

In one embodiment of the invention, a semi-conductor component, in particular a memory component with at least one voltage booster is made available, which provides an appropriate boosted voltage (VPP, VLL), and which is installed in a corresponding voltage boosting area of the semi-conductor component, whereby the voltage boosting area extends essentially parallel to several devices that are to be provide with the boosted voltage (VPP, VLL), in particular essentially parallel to the lines controlled by the devices, for instance word lines.

In this way, the distance between the voltage boosters and the devices to be supplied (for instance corresponding word line driver devices) can be reduced, whereby—unavoidably occurring—voltage losses may be reduced.

BRIEF DESCRIPTION OF THE DRAWINGS

The invention is described in more detail below with reference to exemplary embodiments which are illustrated in the accompanying drawings. In the drawings.

DETAILED DESCRIPTION OF THE INVENTION

Figure 1:
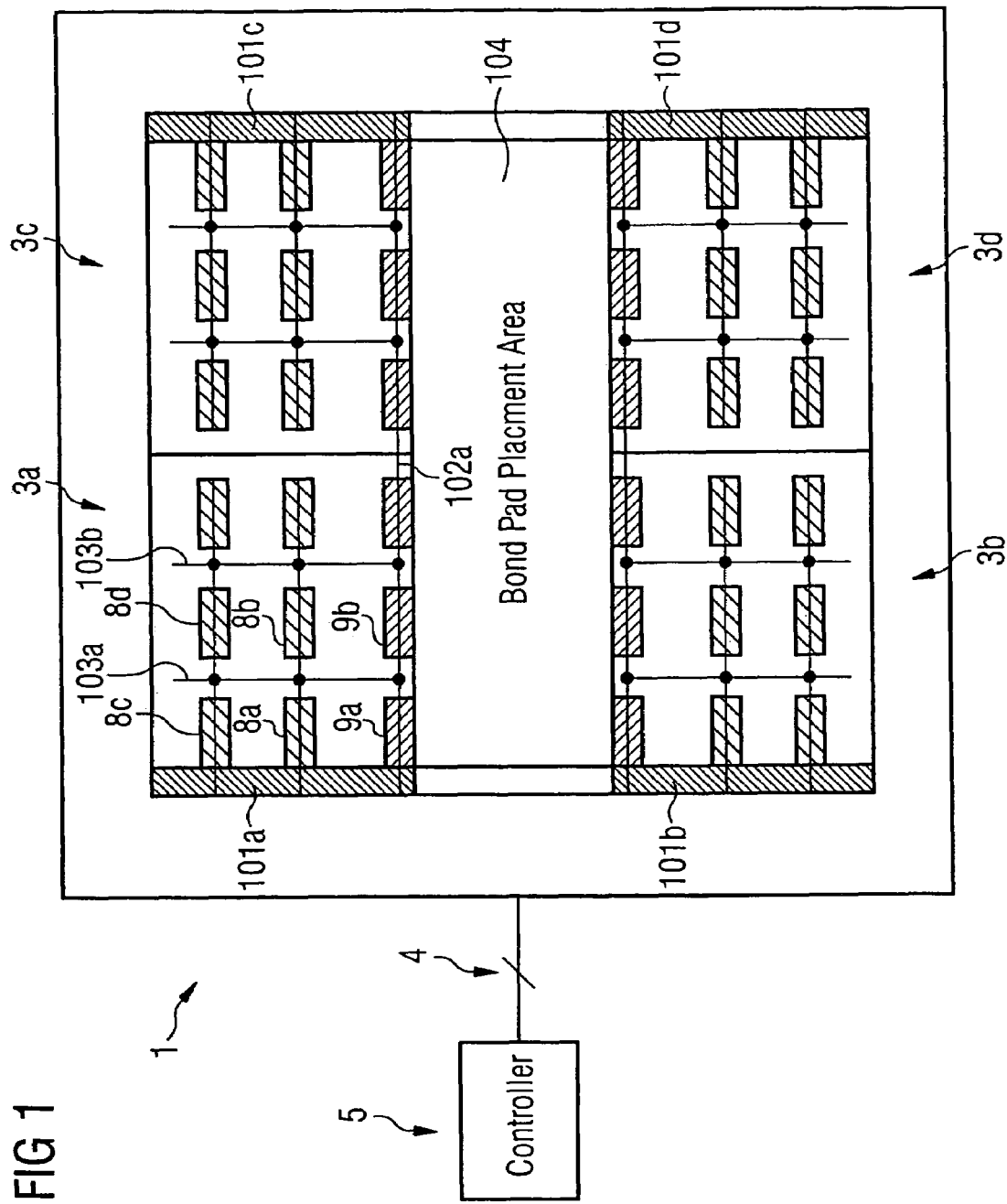
FIG. 1 shows construction of a semi-conductor memory component with several arrays, and a memory component control device according to an embodiment example of the present invention.

In FIG. 1, a schematic representation of the construction of a semi-conductor memory component 1 and/or a semi-conductor memory chip, as well as of a—central—memory component control device 5 is shown.

The semi-conductor-memory component 1 may be, for example, a table memory component, or a RAM memory component (RAM=Random Access Memory and/or read/write memory)—based on CMOS technology—in particular a DRAM memory component (DRAM=Dynamic Random Access Memory and/or dynamic read/write memory) (for instance a graphics DRAM, or a DDR DRAM (Double Data Rate DRAM)).

In the semi-conductor memory component 1, data can be stored at a particular address—after entering that address (for instance by means of the memory component control device 5)—and later read out again under that address.

The address may be entered in several, for example two successive steps (for instance first a row address—and where needed, parts of a column address (and/or if required, further address parts or sections thereof), followed by the column address)(and/or the remaining parts of the column address, and/or—only then—the above further address parts (and/or the remaining parts thereof)).

By applying an appropriate control signal (for instance a read/write signal)—it can be decided in each case by the memory component control device 5, whether data is to be stored or read out.

The data input into the semi-conductor-memory component 1 is stored there in corresponding memory cells, as is more closely described below, and later read out again from the corresponding memory cells.

Each memory cell for instance includes a few elements, in particular of a single, appropriately controlled capacitor, with the capacitance of which one bit at a time can be stored as a charge.

As is apparent from FIG. 1, a particular number of memory cells—lying adjacent to each other in several rows and columns—are in each case arranged in a rectangular and/or square array ("memory bank") 3a, 3b, 3c, 3d, so that—according to the number of memory cells included in an array 3a, 3b, 3c, 3d—32 Mbit, 64 Mbit, 128 Mbit, 256 Mbit, 512 Mbit, etc. can for instance be stored in each case.

As is further shown in FIG. 1, the semi-conductor-memory component 1 includes several, for instance four, memory cell arrays 3a, 3b, 3c, 3d (here: the above "memory banks"), each essentially identically constructed, evenly spread over the area of the component, and controlled—essentially independently—by the above memory component control device 5 so that the semi-conductor memory component 1 accordingly contains a total memory capacity of for instance 128 Mbit, 256 Mbit, 512 Mbit, and/or 1024 Mbit (and/or 1 Gbit), 4 Gbit, etc.

By providing several essentially independent arrays 3a, 3b, 3c, 3d, it can be achieved that several corresponding read or write actions can be performed—in parallel and/or chronologically overlapping—at the different arrays 3a, 3b, 3c, 3d.

The above address (input into the semi-conductor-memory component 1 and/or the memory component control device 5) includes—as part of the above further address parts—a corresponding number of bits ("bank address bits")—here for instance two—serving to address the array 3a, 3b, 3c, 3d required in each case for storing and/or reading out data.

As is more closely described below, the above memory cells in the arrays 3a, 3b, 3c, 3d are always arranged to lie in corresponding—vertically superimposed and/or horizontally juxtaposed—cell fields and/or "cell field areas" 7a, 7b, 7c, 7d (cf. for instance the cell field areas 7a, 7b, 7c, 7d shown in FIG. 2 as examples—provided in the array 3a lying in the top left in FIG. 1—as well as numerous further cell areas, in the representation in terms of FIG. 2 for instance lying to the right and above and/or below the cell field areas 7a, 7b, 7c, 7d (not shown here)).

The cell field areas 7a, 7b, 7c, 7d are essentially identically constructed, essentially rectangular (or for instance square), and each includes a particular number of memory cells—lying adjacent to each other in several rows and columns.

Between each two cell fields 7a, 7b, 7c, 7d (and/or—in the representation in terms of FIG. 2—in each case to the left and/or right of a cell field 7a, 7b, 7c, 7d) there are—here likewise essentially rectangular—sense amplifier areas 10a, 10b, 10c, 10d, 10e, 10f ("sense amplifier areas").

In each of the sense amplifier areas 10a, 10b, 10c, 10d, 10e, 10f numerous sense amplifiers are arranged, whereby the corresponding sense amplifier (and/or more accurately: the sense amplifier in each of the sense amplifier areas 10b, 10c, 10e, 10f, always arranged to lie between two different cell fields 7a, 7b, 7c, 7d), is in each case allocated to two different cell fields 7a, 7b, 7c, 7d (namely the cell fields 7a, 7b, etc., directly adjacent to the corresponding sense amplifier area—for instance the sense amplifier area 10b), hence, in the present embodiment example a so-called "shared sense amplifier" 11 is used.

Again referring to FIG. 1, each array 3a, 3b, 3c, 3d contains an array control device ("bank control")—not shown here—separately allocated to each of the arrays 3a, 3b, 3c, 3d (which bank control may for instance be installed in a corner of each of the arrays 3a, 3b, 3c, 3d).

In terms of FIG. 1 and FIG. 2, segment driver areas and/or sub-decoder areas 8a, 8b, 8c, 8d—here also essentially rectangular—are found between each two cell fields 7a, 7b, 7c, 7d (and/or—in the representation in terms of FIG. 1 and FIG. 2—in each case above and/or below a cell field 7a, 7b, 7c, 7d).

In each of the segment driver areas 8a, 8b, 8c, 8d, numerous corresponding segment and/or word line driver devices, in particular corresponding driver devices for corresponding local word lines 13a, 13b, 13c, 14a, 14b, 14c (LWL and/or local word line) are been arranged (whereby for instance each of the driver devices can be connected to a corresponding allocated local word line 13a, 13b, 13c, 14a, 14b, 14c).

Figure 2:
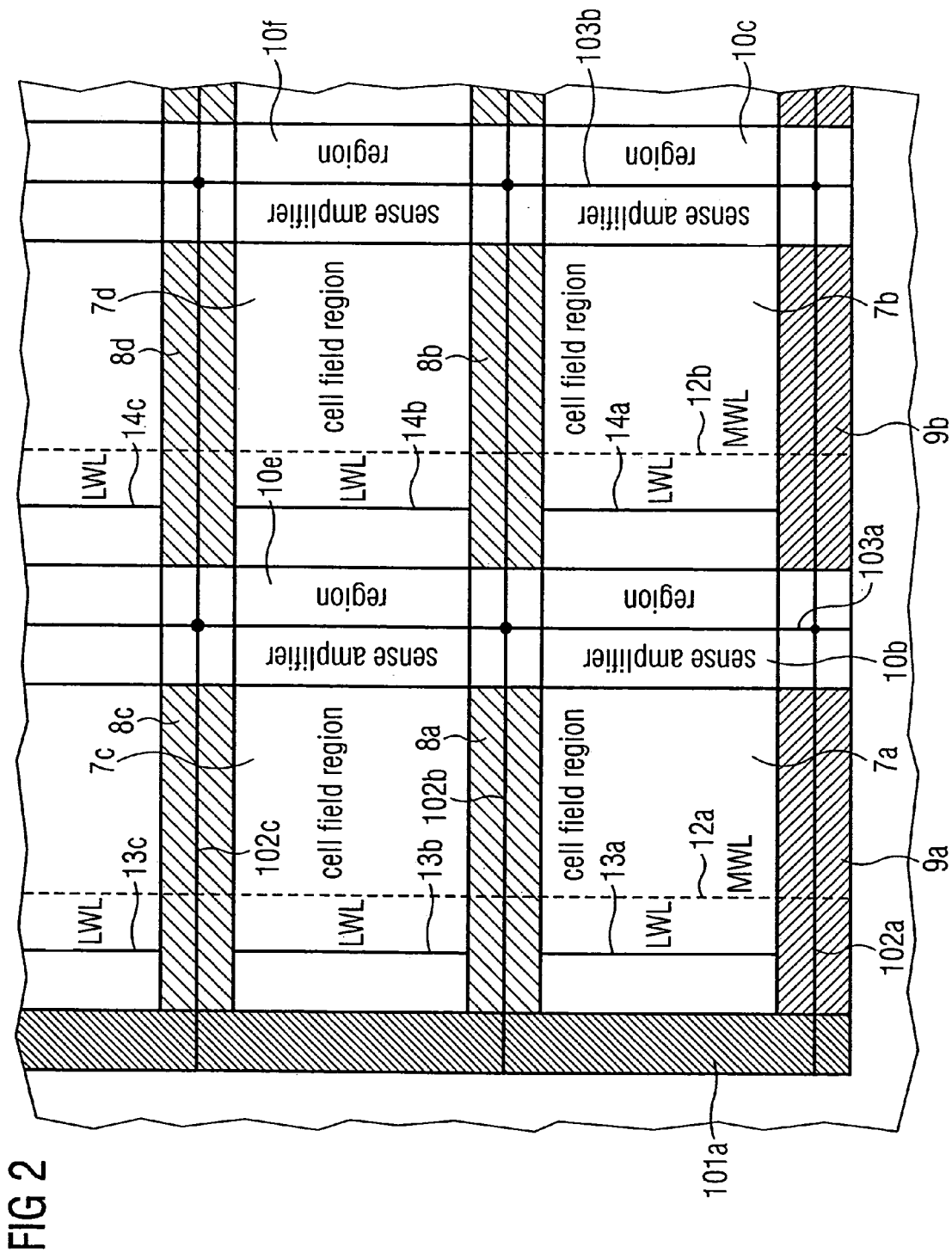
FIG. 2 shows construction of a section of one of the arrays of the semi-conductor-memory component shown in FIG. 1.

As is apparent from FIG. 2, the local word lines 13a, 13b, 13c, 14a, 14b, 14c—represented in FIG. 2 by means of corresponding extended lines—run in each case through one of the numerous array cell field areas 7a, 7b, 7c, 7d, in particular—for example longitudinally—from a particular segment driver area and/or sub-decoder area 8a, 8b, 8c, 8d to the next segment driver area and/or sub-decoder area 8a, 8b, 8c, 8d.

The number of word lines provided for the cell field areas 7a, 7b, 7c, 7d may for example correspond to the number of memory cell rows in each cell field area 7a, 7b, 7c, 7d (or for instance—for example during the simultaneous reading/ storing of several, for instance 2, 4, or 8 bits—corresponding to a fraction of it (for instance half, a quarter or an eighth)).

As is apparent from FIG. 1 and FIG. 2, there is a segment control area on a boundary area—lying under (and/or above)—the corresponding cell fields 7a, 7c and/or 7b, 7d of each array 3a, 3b, 3c, 3d 9a, 9b, in which—as is more closely described below—numerous word line driver devices have been installed, in particular driver devices for corresponding master word lines 12a, 12b (MWL=master word line) (whereby for instance in each case one of the driver devices may be connected to a corresponding, master word line 12a, 12b allocated to it).

As is apparent from FIG. 2, the master word lines 12a, 12b—shown by broken lines in FIG. 2—always extend from corresponding segment control areas 9a, 9b across numerous, superimposed cell field areas 7a, 7c and/or 7b, 7d of an array 3a, in particular—for example longitudinally—from the corresponding segment control area 9a, 9b across all the cell field areas 7a, 7c and/or 7b, 7d, vertically superimposed (and thereby also across the sub-decoder areas 8a, 8c and/or 8b, 8d lying between the corresponding cell field areas 7a, 7c and/or 7b, 7d).

The individual word lines 12a, 12b and/or 13a, 13b, 13c, 14a, 14b, 14c, running across a corresponding cell field area 7a, 7b, 7c, 7d, may for instance be arranged—equidistantly spaced—parallel to each other (and running parallel to the outside boundary of the cell fields 7a, 7b, 7c, 7d).

Numerous bit lines and/or bit line pairs (not shown in FIG. 1 and FIG. 2) furthermore also run vertically to the word lines 12a, 12b, 13a, 13b inside each of the cell field areas 7a, 7b, 7c, 7d, for example from the sense amplifier areas 10a, 10b, 10c 10d allocated to each cell field area 7a, 7b, 7c, 7d.

The number of bit lines provided per cell field area 7a, 7b, 7c, 7d may for example correspond to the number of memory cell columns in each of the cell field areas 7a, 7b, 7c, 7d, or for instance to a multiple of them.

The individual bit lines and/or bit line pairs may for instance be arranged—equidistantly spaced—parallel to each other (and running parallel to the outside boundary of each of the cell field areas 7a, 7b, 7c, 7d, and—as already mentioned above—vertically to the above word lines 12a, 12b and/or 13a, 13b, 13c, 14a, 14b, 14c).

The—central—memory component control device 5 ("memory controller") may be constructed as a separate semi-conductor component—as shown as an example in FIG. 1—linked via external pins—by means of an external bus system 4—to the DRAM semi-conductor memory component 1.

Alternatively, the memory component control device 5 may also for example be arranged on one and the same chip 1 as the above memory cell arrays (memory banks) 3a, 3b, 3c, 3d.

In the semi-conductor-memory component 1 shown in FIG. 1, a voltage level VINT used inside component 1 (for the numerous components in the semi-conductor memory component 1) may differ from a voltage level (supply voltage level) VDD used outside the semi-conductor memory component 1, for example from an external voltage supply provided for the semi-conductor-memory component 1.

In particular, the internally used voltage level VINT may be lower than the level VDD of the supply voltage—for example the internally used voltage level VINT may amount to 1,5 V, and the supply voltage level VDD for instance to between 1,5 V and 2,5 V, etc.

In contrast, the above driver devices—installed in the above segment driver areas 8a, 8b, 8c, 8d—(in particular the above sub-decoder—and/or local word line driver devices), and/or the above driver devices (in particular the above master word line driver devices)—installed in the above segment control areas 9a, 9b—can be operated at the "boosted" voltage level made available by one or several corresponding voltage booster devices (for example at a voltage level VPP—for instance representing a "high logic" word line signal—which is higher than the level VDD of the above external voltage (in particular higher than 0 V, in particular higher than 1,8 V), and at a voltage level VLL, for instance representing a "low logic" word line signal, which may be for instance lower than 0 V).

These voltage booster devices may for example—as illustrated in FIG. 1 and FIG. 2—be installed in voltage booster areas 101a, 101b, 101c, 101d, in each case lying outside and alongside corresponding arrays and/or central array areas 3a, 3b, 3c, 3d.

As is apparent from FIG. 1, the—essentially longitudinally elongated rectangular—voltage booster areas 101a, 101b, 101c, 101d extend essentially parallel to the above word lines 12a, 12b and/or 13a, 13b, 13c, 14a, 14b, 14c, essentially crossing over to a corresponding segment driver area 8a, 8b, 8c, 8d, and/or segment control area 9a, 9b, and essentially across the whole length of a corresponding array 3a, 3b, 3c, 3d.

The voltage booster area 101a, 101b, 101c, 101d allocated to each of the arrays 3a, 3b, 3c, 3d, is installed so that it lies directly adjacent to each array and/or central array area 3a, 3b, 3c, 3d (and/or directly adjacent to the corresponding segment control area 9a, 9b, and/or the corresponding segment driver area 8a, 8b, 8c, 8d), for instance in an array boundary area lying opposite to each neighboring array 3a, 3b, 3c, 3d).

As is apparent from FIGS. 1 and 2, the voltage boosters installed in a particular voltage booster area 101a, 101b, 101c, 101d are connected via a network of lines 102a, 102b, 102c, 103a, 103b and/or pairs of lines, to the above segment driver areas 8a, 8b, 8c, 8d (in particular to the local word line driver devices installed there), and to the above segment control areas 9a, 9b (in particular to the master word line driver devices installed there)—as well as to one or several other voltage boosters of each of the voltage booster areas 101a, 101b, 101c, 101d (and to one or several further voltage boosters of the other voltage booster areas 101a, 101b, 101c, 101d).

In this embodiment example for instance, in particular the voltage boosters installed in the voltage booster area 101a of the arrays 3a in terms of FIG. 1 and FIG. 2, are connected via a line 102a (and/or via a corresponding pair of lines)—running across to the word lines 12a, 12b, 13a, 13b, 13c—to the above segment control areas 9a, 9b of the array 3a (in particular to the master word line driver devices installed there), as well as—also via the above line 102a (and/or via a corresponding pair of lines)—to corresponding segment control areas of the array 3c, and to one or several voltage boosters of the voltage booster areas 101c of the array 3c.

Furthermore, the voltage boosters installed in the voltage booster area 101a of the array 3a are connected via a line 102b (and/or via a corresponding pair of lines)—running across to the word lines 12a, 12b, 13a, 13b, 13c—to the above segment driver areas 8a, 8b of the array 3a (in particular to the local word line driver devices installed there), as well as—also via a line 102c (and/or via a corresponding pair of lines also running across to the word lines 12a, 12b, 13a, 13b, 13c), to the above segment driver areas 8c, 8d of the array 3a (in particular to the local word line driver devices installed there), etc.

The above lines 102a, 102b, 102c (and/or pairs of lines) are interconnected via lines 103a, 103b, 103c (and/or pairs of lines) running across them (i.e. running parallel with the word lines 12a, 12b, 13a, 13b, 13c for instance through the corresponding sense amplifier areas 10b, 10e, 10c, 10f).

The lines network provided in the further arrays 3b, 3c, 3d—for connecting the corresponding voltage boosters with the corresponding segment control areas and/or master word line driver devices, segment driver areas and/or local word line driver devices, etc.—can be constructed as corresponding mirror images, as with the above array 3a.

The voltage levels VPP, VLL, emitted and/or made available by the corresponding voltage boosters are relayed—via the above lines network (i.e. the corresponding lines 102a, 102b, 102c, 103a, 103b and/or pairs of lines) to the corresponding segment control areas 9a, 9b and/or segment driver areas 8a, 8b, 8c, 8d, so that the local word line driver devices and/or master word line driver devices installed there can be operated with the corresponding "boosted" voltage levels VPP, VLL (for instance by means of a voltage level VPP—which is higher than the level VDD of the above external voltage—and for instance representing a "high logic" word line signal, and for instance by means of a voltage level VLL—representing a "low logic" word line signal—which may for instance be lower than 0 V).

As is apparent from FIG. 1, a relatively large number of bond pads can—because of design and installation of the voltage booster areas 101a, 101b, 101c, 101d—be provided in a central bonding area 104 of the semi-conductor-memory component 1.

As the voltage boosters—within the corresponding voltage booster areas—can be installed in divided form (in particular—longitudinally—evenly divided), the distance between the boosters and the corresponding drivers is smaller than with conventional designs, which leads to reduced voltage losses.

In order to perform a "read" or "write" operation at the semi-conductor memory component 1, a particular, fixed sequence of commands—as with conventional semi-conductor memory components—must be performed:

For example first—by means of a word line activation command (activate command (ACT))—a corresponding word line, in particular one allocated to a particular array 3a (and defined by the row address) is activated (for instance so that first a corresponding master word line 12a—for example allocated to several superimposed cell fields 7a, 7c, and running right through them—is activated, for instance by a corresponding master word line driver installed for instance in a corresponding segment control area 9a—and in reaction to this the corresponding local word line 13a—running between two corresponding cell fields 7a, 7c—is activated, for instance by means of a corresponding local word line driver, lying for instance between the corresponding cell fields in a corresponding segment driver area 8a).

This has the effect that the data values stored in the memory cells allocated to the corresponding word line 13a are read out by the sense amplifier allocated to the corresponding word line 13a ("activated state" of the word line 13a).

Then—with the aid of a corresponding write or read command (Read (RD) and/or Write (WT) command)—it is ordered that the corresponding—by then accurately specified data of the corresponding column address is correspondingly emitted by the corresponding sense amplifier allocated to the bit line specified by the column address (or—conversely—that the data is written into the corresponding memory cells).

Next, by means of a word line deactivation command (for instance a pre-charge command (PRE command)) the corresponding word line 13a is deactivated again, and the corresponding array 3a is prepared for the next word line activation command (ACT).

Alternatively, corresponding write and/or read actions can be performed in any other fashion (where needed by using other commands and/or command sequences, etc.).

The invention claimed is:

1. A semiconductor memory component, comprising:
a plurality of memory cell arrays;
a plurality of bond pads installed in a bond pad area; and
a plurality of supply voltage boosters, which are installed in a supply voltage booster area of the memory component, and which make available corresponding, boosted supply voltages to be supplied to word line driver devices, wherein
the supply voltage booster area is arranged in an area laterally outside of the plurality of memory cell arrays, and extends perpendicularly to an area with word line driver devices to be supplied with the boosted supply voltages, and perpendicularly to the bond pad area which is arranged in a central area of the memory component located between the memory cell arrays and parallel to word lines driven by the word line driver devices.

2. The semi-conductor component according to claim 1, in which the voltage booster area extends essentially parallel to word lines controlled by the devices.

3. The semi-conductor component according to claim 1, in which the voltage boosters are essentially, evenly distributed over the voltage booster area in relation to a longitudinal axis of the voltage booster area.

4. The semi-conductor component according to claim 1, in which the voltage booster area essentially extends along a whole length of a memory cell array installed in the semi-conductor component.

5. The semi-conductor component according to claim 1, in which the voltage booster area is installed in a boundary area of the semi-conductor component lying alongside and not between the memory cell arrays.

* * * * *